(12) United States Patent
Abass et al.

(10) Patent No.: US 12,132,151 B2
(45) Date of Patent: Oct. 29, 2024

(54) NANOCONE ARRAYS FOR ENHANCING LIGHT OUTCOUPLING AND PACKAGE EFFICIENCY

(71) Applicant: Lumileds LLC, San Jose, CA (US)

(72) Inventors: Aimi Abass, Aachen (DE); Toni Lopez, Aachen (DE); Isaac Wildeson, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/455,047

(22) Filed: Jun. 27, 2019

(65) Prior Publication Data
US 2020/0411724 A1 Dec. 31, 2020

(51) Int. Cl.
*H01L 33/46* (2010.01)
*H01L 33/04* (2010.01)
*H01L 33/20* (2010.01)
*H01L 33/32* (2010.01)

(52) U.S. Cl.
CPC .............. *H01L 33/46* (2013.01); *H01L 33/04* (2013.01); *H01L 33/20* (2013.01); *H01L 33/32* (2013.01); *H01L 2933/0083* (2013.01)

(58) Field of Classification Search
CPC ......... H01L 33/46; H01L 33/04; H01L 33/20; H01L 33/32; H01L 2933/0083
USPC .......................................................... 257/9
See application file for complete search history.

(56) References Cited

U.S. PATENT DOCUMENTS

| 9,478,703 | B2 | 10/2016 | Sung et al. | |
| 2005/0173718 | A1* | 8/2005 | Shin | H01L 33/44 |
| | | | | 257/E33.068 |
| 2007/0085093 | A1 | 4/2007 | Ohmae et al. | |
| 2007/0145386 | A1 | 6/2007 | Lee et al. | |
| 2007/0187698 | A1* | 8/2007 | Lee | H01L 33/10 |
| | | | | 257/E33.068 |
| 2009/0078955 | A1* | 3/2009 | Fan | H01L 27/15 |
| | | | | 257/98 |
| 2011/0291070 | A1* | 12/2011 | Won | H01L 33/44 |
| | | | | 257/E33.012 |
| 2012/0012874 | A1* | 1/2012 | Morioka | H01L 33/20 |
| | | | | 257/E33.072 |
| 2013/0277697 | A1* | 10/2013 | Lai | H01L 33/20 |
| | | | | 257/98 |

(Continued)

FOREIGN PATENT DOCUMENTS

CN 104518065 A 4/2015
EP 1562238 A2 8/2005

(Continued)

OTHER PUBLICATIONS

EPO as the ISA, Notification of Transmittal of the International Search Report and the Written Opinion, corresponding to PCT/US2020/040080, Sep. 18, 2020, 14 pages.

*Primary Examiner* — Lex H Malsawma
*Assistant Examiner* — Eric W Jones

(57) ABSTRACT

An LED structure includes an epi layer grown on a substrate and a plurality of dielectric nanoantennas positioned within the epi layer. The dielectric antennas can be periodically arranged to reduce reabsorption of light and redirect oblique incident light to improve overall light coupling efficiency. Each of the dielectric nanoantennas can have a top, a bottom, a height less than 1000 nm and greater than 200 nm and a diameter less than 2000 nm and greater than 300 nm.

20 Claims, 7 Drawing Sheets

(56) References Cited

U.S. PATENT DOCUMENTS

| | | | |
|---|---|---|---|
| 2014/0070253 A1* | 3/2014 | Kawase | H01L 33/0091 |
| | | | 257/98 |
| 2015/0123158 A1* | 5/2015 | Sung | H01L 33/10 |
| | | | 257/98 |
| 2015/0228846 A1* | 8/2015 | Ohmae | H01L 21/02647 |
| | | | 257/90 |
| 2017/0104130 A1* | 4/2017 | Lopez | H01L 33/10 |
| 2018/0315887 A1* | 11/2018 | Choi | H01L 33/46 |
| 2019/0115492 A1 | 4/2019 | Tamma et al. | |
| 2020/0287080 A1* | 9/2020 | Kim | H01L 33/0016 |

FOREIGN PATENT DOCUMENTS

| | | |
|---|---|---|
| EP | 1818991 A2 | 8/2007 |
| EP | 2390928 A2 | 11/2011 |
| JP | 2007116097 A | 5/2007 |
| JP | 2018530924 A | 10/2018 |
| TW | 200717876 A | 5/2007 |
| TW | 201505204 A | 2/2015 |
| TW | 201719932 A | 6/2017 |
| WO | 2011/026033 A1 | 3/2011 |

* cited by examiner

NANOCONE ARRAYS FOR ENHANCING LIGHT OUTCOUPLING AND PACKAGE EFFICIENCY

TECHNICAL FIELD

The present disclosure generally relates an LED structure having an epi layer with incorporated dielectric nanoantennas to reduce light reabsorption and allow for redirection of oblique incident light. The dielectric nanoantennas can be periodically arranged in one or more layers.

BACKGROUND

Loss of light in LED structures based on Gallium Nitride (GaN) or similar epitaxial (epi) layers grown on patterned sapphire substrates (PSS) is a significant problem, at least in part because emitting die and epi layers can also strongly reabsorb returning light. A PSS can facilitate light outcoupling by means of surface texturing at a GaN-Sapphire substrate interface that promotes photon randomization to extract photons moving from a high refractive index (RI) material into a low index material. However, the PSS structure also allows efficient re-entry into GaN for light returning to the GaN-Sapphire interface and thus increase reabsorption loss in the epi layers.

In addition to losses due to light returning through the PSS structure, light can also be lost due to high absorption loss in the die and epi layers (due to high number of bounces), high absorption loss in a side-coating layer and limited transmissivity of oblique radiation at the GaN-Substrate interface. Structures that reduce such light loss are needed.

SUMMARY

In accordance with embodiments of the invention, An LED structure includes an epi layer grown on a substrate and a plurality of dielectric nanoantennas positioned within the epi layer. The dielectric nanoantennas can be periodically arranged to reduce reabsorption of light and redirect oblique incident light to improve overall light coupling efficiency. Each of the dielectric nanoantenna can have a top, a bottom, a height less than 1000 nm and greater than 200 nm and diameter less than 2000 nm and greater than 300 nm.

In some embodiments, the substrate is patterned sapphire and the epi layer is GaN. The top of the dielectric nanoantennas can be flat and the bottom of the dielectric nanoantennas narrowed with respect to the top.

In some embodiments, the top of the dielectric antennas are positioned parallel and adjacent to the substrate; while in other embodiments the bottom of the dielectric antennas are positioned parallel and adjacent to the substrate.

In some embodiments at least some of the plurality of dielectric nanoantennas positioned within the epi layer define a periodic pattern in a plane. Multiple periodic planes of dielectric nanoantennas can be defined in the epi layer.

Typically, the dielectric nanoantennas have symmetric solid shapes such as a cone, and in some variations the dielectric nanoantennas can be formed to have a core and shell structure.

In another embodiment, an LED structure includes a first epi layer grown on a substrate. An active region in the first epi layer is positioned adjacent to a tunnel junction layer. A first plurality of dielectric nanoantennas are positioned within the first epi layer between the active region and substrate. A second epi layer is positioned between the tunnel junction layer and a contact layer, and a second plurality of dielectric nanoantennas is positioned within the second epi layer. A second active region in the second epi layer may be present.

In one embodiment at least some of the first plurality of dielectric nanoantennas positioned within the epi layer define a periodic pattern in a plane having a periodic spacing different from that of the second plurality of dielectric nanoantennas.

In another embodiment, an LED structure includes an epi layer and a plurality of dielectric nanoantennas positioned within the epi layer. The dielectric nanoantennas can be arranged in a periodic plane (e.g. with hexagonal spacing) having a periodic spacing between 600 and 3000 nm, with each dielectric nanoantenna being tapered to have differing top and bottom sizes. Height of each dielectric nanoantenna is less than 1000 nm and greater than 200 nm. Base diameter of each dielectric nanoantenna is less than 2000 nm and greater than 300 nm. Each dielectric nanoantenna has a refractive index between 1.0 and 1.5.

Additional structures surrounding the described structures and layers can be also used. For example, underlying mirror or non-mirrored contact layers, sidewall absorbers, reflectors, and mirrors, and protective layers can be used to package and enhance efficiency of the described LED structure. In addition, phosphors, transparent protective layers, and optics including converging or diverging lenses, microlenses, diffusers, or reflectors.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
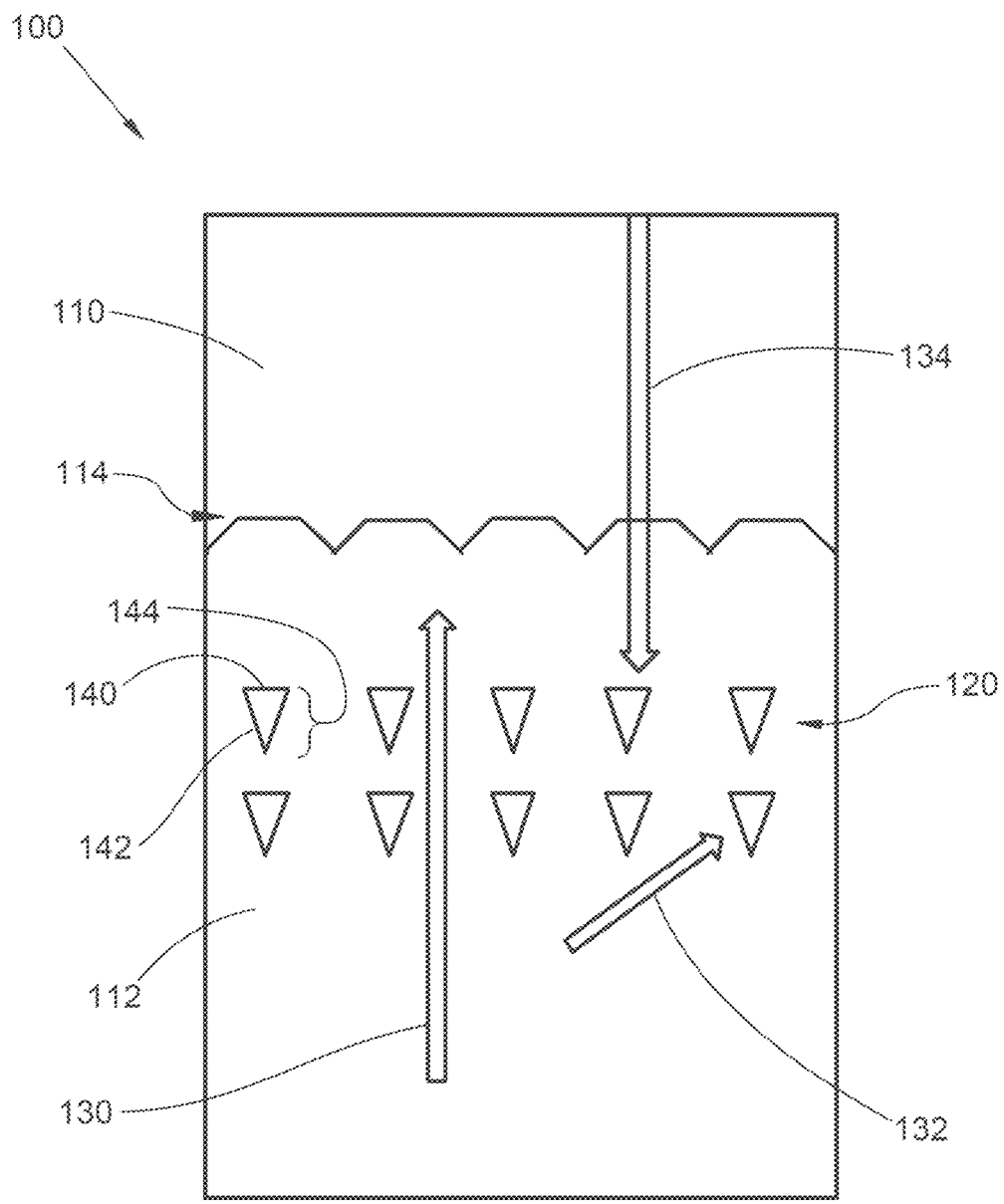
FIG. 1 illustrates an LED structure with dielectric nanoantennas embedded in the epi.

FIG. 1 shows an LED structure 100 with dielectric nanoantennas embedded in the epi 120 that can reduce reabsorption of light and redirect oblique incident light to improve overall light coupling efficiency. A substrate 110 has an epitaxial layer 112 grown on an interface 114. In the illustrated embodiment, substrate 110 and interface 114 can be a patterned sapphire substrate. Typically, the epitaxial layer 112 is a semiconductor n-layer. A semiconductor p-layer can be sequentially grown or deposited on the n-layer, forming an active region at the junction between layers to emit light. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials.

During growth of the epitaxial layer 112, dielectric nanoantenna 120 can be grown or deposited in various configurations, including but not limited to tapered solids, symmetrical solid pyramids, hexahedrons, or octahedrons, or conical forms. Materials forming the dielectric nanoantenna can include but are not limited to SiOx. Each of the dielectric nanoantennas can have a flat top 140, a pointed or narrowed bottom 142, and a height 144 of less than 1000 nm and greater than 200 nm. The dielectric nanoantennas can be periodically arranged along a single plane, and multiple planes of nanoantennas can be formed.

In operation, light 130 vertically passing through the epitaxial layer 112 toward the interface 114 and substrate 110 will be minimally affected by the dielectric nanoantennas. However, use of the described dielectric nanoantennas 120 increases the likelihood any back reflected light 134 will be more likely to be reflected back toward the interface 114 as well. Incoming oblique light from the epitaxial layer 132 will be partially redirected along the vertical toward the interface 114.

Figure 2:
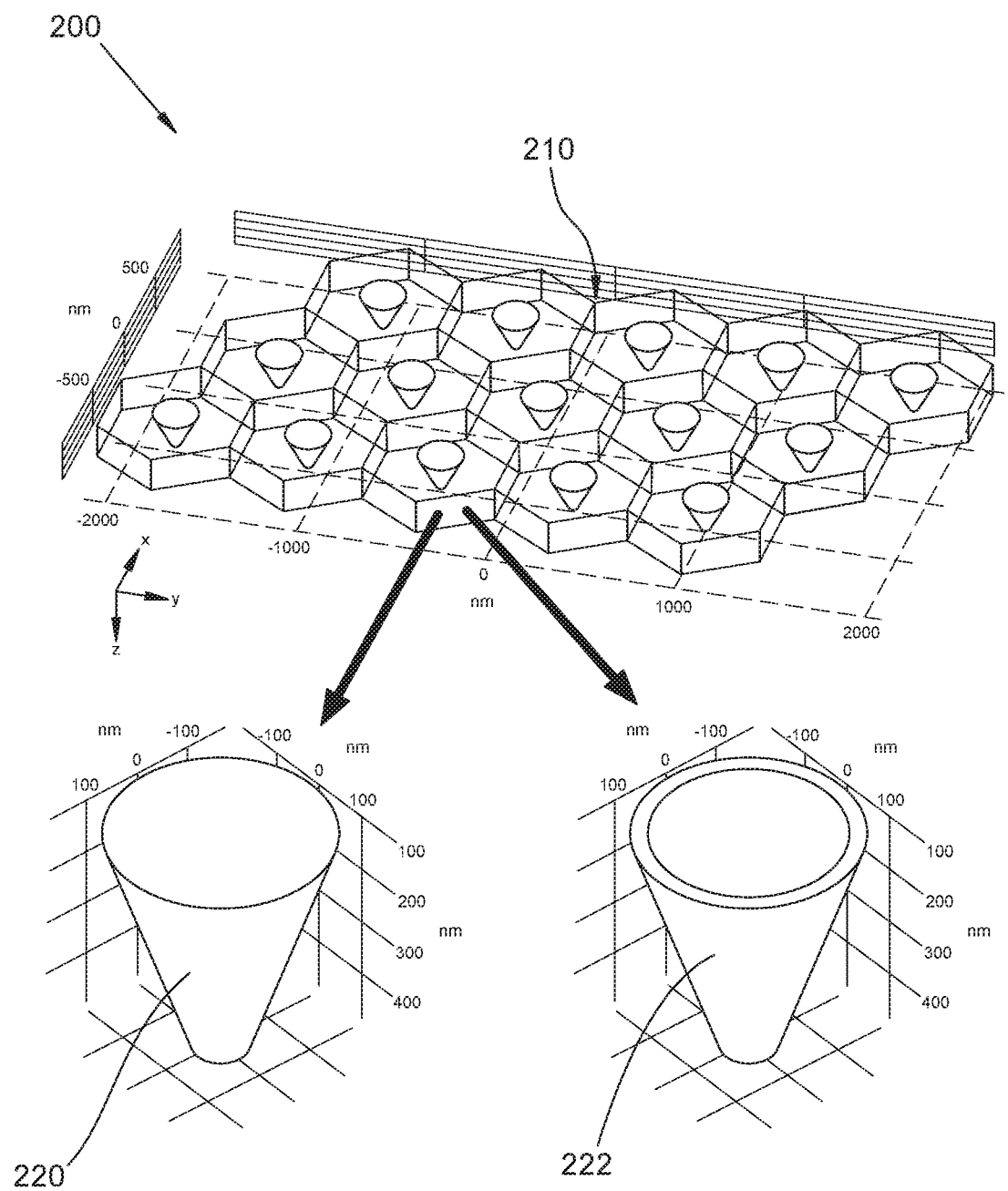
FIG. 2 illustrates an example conical shape and hexagonal spacing of dielectric nanoantenna.

In effect, geometrical vertical asymmetry of elongated, tapered or conical dielectric nanoantennas can translate to an optical reflectance/transmittance response asymmetry, depending on whether light is incoming from the sharp or flat side of the conical nanoantennas, with proper tuning of the size parameters and material and when oriented vertically and placed in a planar array configuration. To enhance this optical reflectance/transmittance asymmetry, multiple vertical stacks of dielectric nanoantenna arrays can be formed. In one embodiment light incoming from the top and flat side of the cones experiences significantly larger reflectance as compared to light incoming from the sharp side of the cones over a large angular range of 0-45 degrees. In one embodiment, by placing these nanoantenna arrays in the GaN epi layer below a sapphire substrate/GaN epitaxial layer interface, light reabsorption of emitted light can be reduced, without severely sacrificing outcoupling of light from the GaN epilayer. This is illustrated in FIG. 2, which is an illustration 200 of a planar hexagonally arranged layer 210 of dielectric nanoantennas. Both solid 220 and core/shell (comprising of different materials) 222 dielectric nanoantennas are further shown.

As another effect, elongated, tapered or conical dielectric nanoantennas arranged in a planar array configuration can cause oblique light to interact more with the dielectric nanoantennas as compared to near normal incident light, which result in light entering sapphire to be more collimated.

Figure 3:
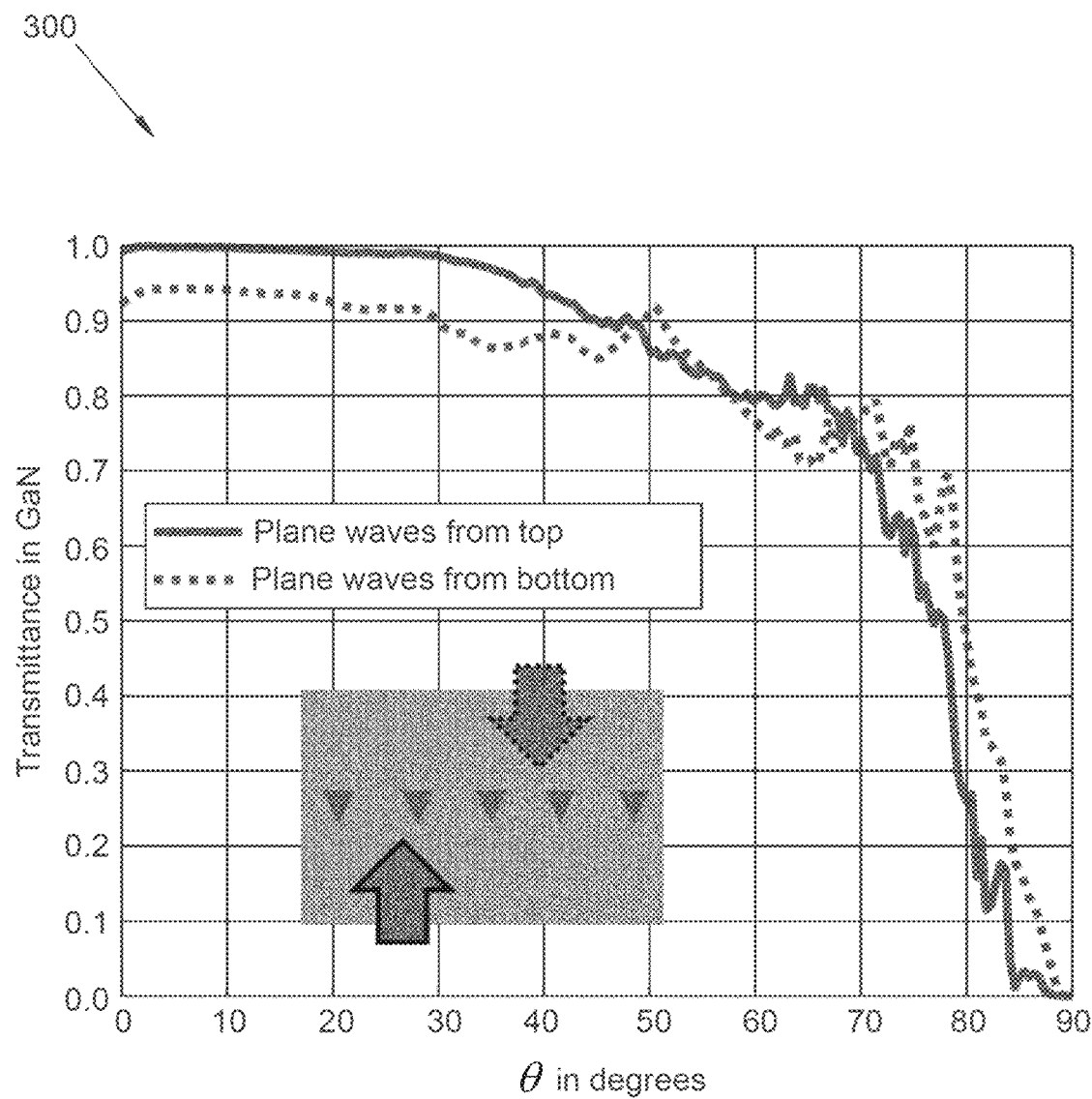
FIG. 3 illustrates differential transmittance response for light passing through dielectric nanoantenna from top and bottom sides.

FIG. 3 is a graph 300 that illustrates differential transmittance response for light passing through a dielectric nanocone array from the top and bottom sides. Azimuth averaged transmission of plane waves incoming to a dielectric nanocone array embedded in GaN is seen to be a function of the polar angle. This demonstrates a substantially different transmittance response depending on whether light is incoming from the top (the flat side of the nanocones) or bottom side (the sharp side nanocones) of the array.

Elongated, tapered or conical dielectric nanoantennas can be formed various techniques, including imprint lithography. For example, stacked arrays of SiOx nanocone arrays can be fabricated by a series of GaN epitaxial growth stops followed by ex-situ fabrication of SiOx nanocones by means of imprint lithography using sol-gel material. Multiple other patterning techniques could be used to produce the SiOx (or other material with different refractive index than GaN) nanocones as well. Once the SiOx nanocone planar array is formed on the surface of GaN, further GaN epitaxy can subsequently grow selectively around these dielectric nanocones. Advantageously, such growth will result in insignificant GaN nucleates on top of the nanocones due to surface energy considerations, resulting in a high crystal quality. This process can be repeated for the desired number of stacked nanocone arrays. Such processing is easier for nanocone structures that are pointing away from PSS substrate (as in FIG. 1) as the flat top part of the nanocone is what contacts the epi surface during fabrication. However, inverted nanocones can be formed using other techniques discussed in more detail with respect to FIG. 5.

Figure 4:
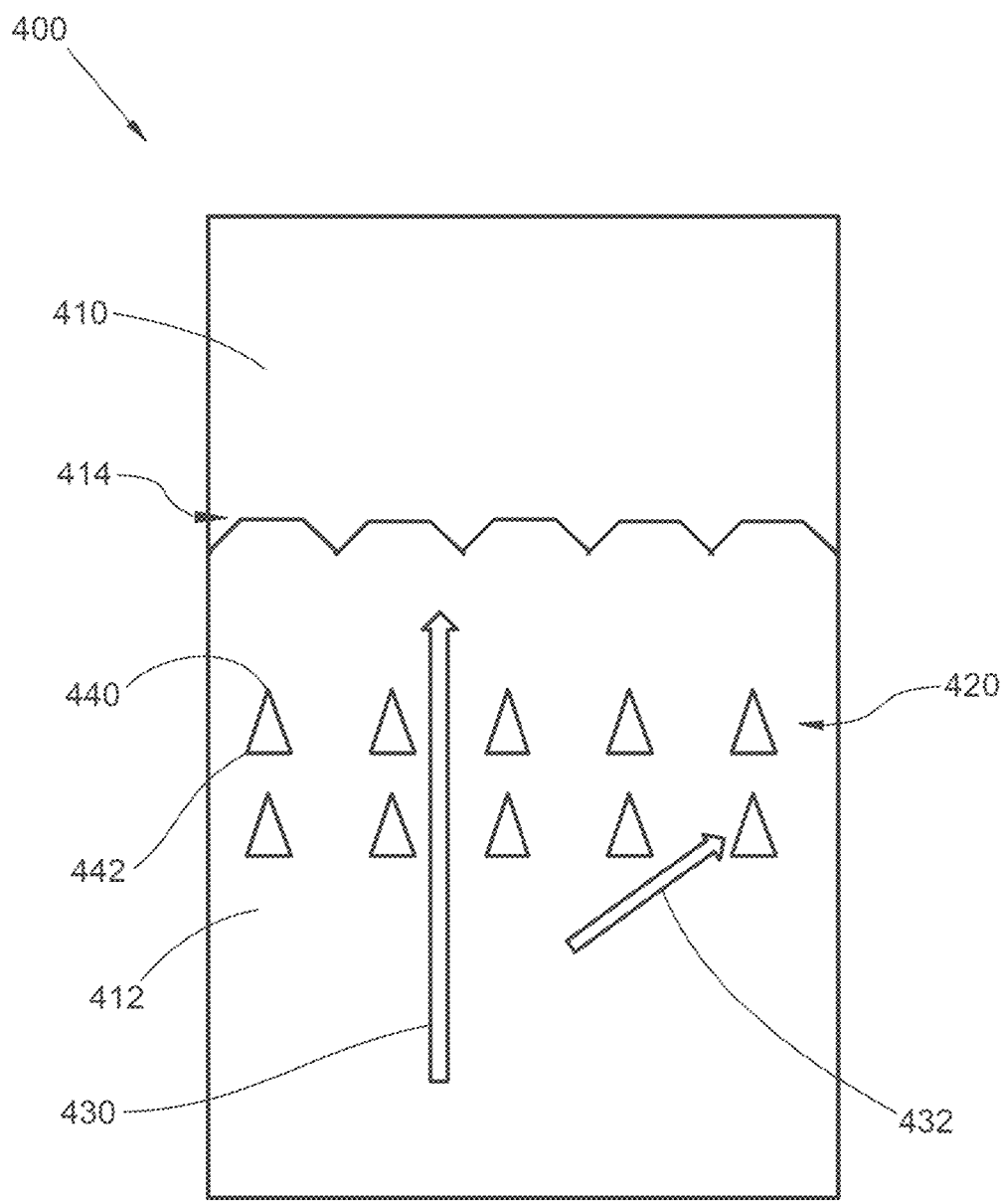
FIG. 4 illustrates an alternative embodiment with top sides of the dielectric antenna being narrowed with respect to the bottom sides.

FIG. 4 illustrates an alternative embodiment with top sides of the dielectric antenna being narrowed with respect to the bottom sides. This alternative LED structure 400 with has an inverted dielectric nanoantenna embedded in the epi 420 that can more redirect oblique incident light to improve overall light coupling efficiency. A substrate 410 has an epitaxial layer 412 grown on an interface 414. In the illustrated embodiment, substrate 410 and interface 414 can be a patterned sapphire substrate. During growth of the epitaxial layer 412, dielectric nanoantenna 420 can be grown to have a pointed or narrowed top 140 and a flat bottom 142. The dielectric nanoantennas can be periodically arranged along a single plane, and multiple planes of nanoantennas can be formed.

In operation, light 430 vertically passing through the epitaxial layer 412 toward the interface 414 and substrate 410 will be more affected by the dielectric nanoantennas as compared to the opposite arrangement shown in 120. However, the prescribed usage of dielectric nanoantennas 420 increases the redirection of oblique light 432 along the vertical direction toward the interface 414.

Figure 5:
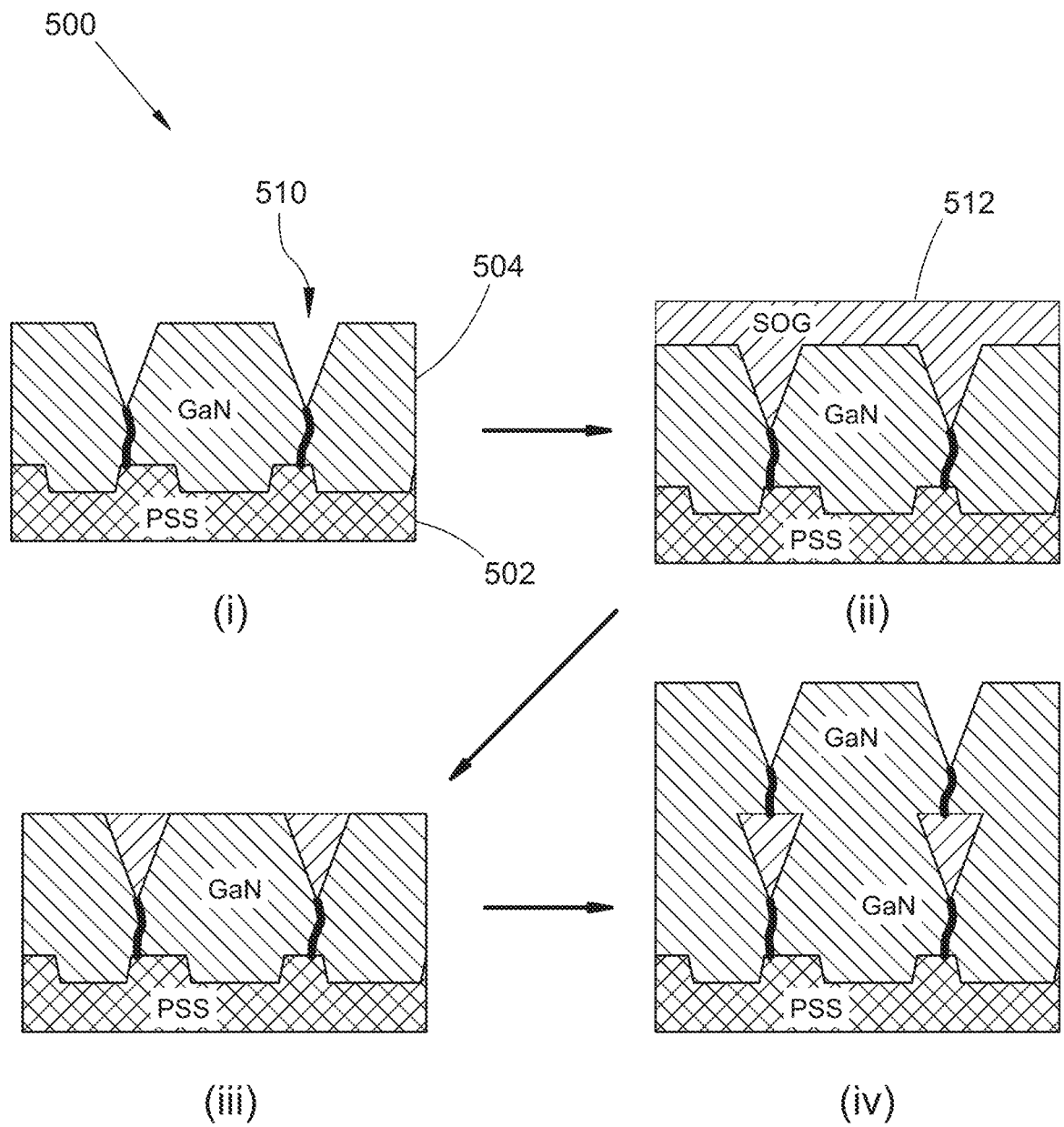
FIG. 5 illustrates one process for forming inverted dielectric antenna.

FIG. 5 illustrates one process for forming an inverted dielectric antenna such as described with respect to FIG. 4. As seen in a process illustration 500, in a first step (i) v-pit structures are formed in GaN epitaxially grown on a PSS in periodic dislocations formed by controlling growth conditions (e.g., temperature). The shape of the v-pits is a hexagonal pyramid that is defined by the crystal facets during GaN growth. In a second step (ii) exsitu spin-on glass (SOG, SiOx) is applied to fill the v-pit structures. In step (iii) blanket RIE or other planarization processing step is used to remove excess SIOx to create a periodic array of cone-like structures pointing toward the PSS substrate. This process can be repeated (step iv) to form two or more stacked planar layers of dielectric nanocones.

Figure 6:
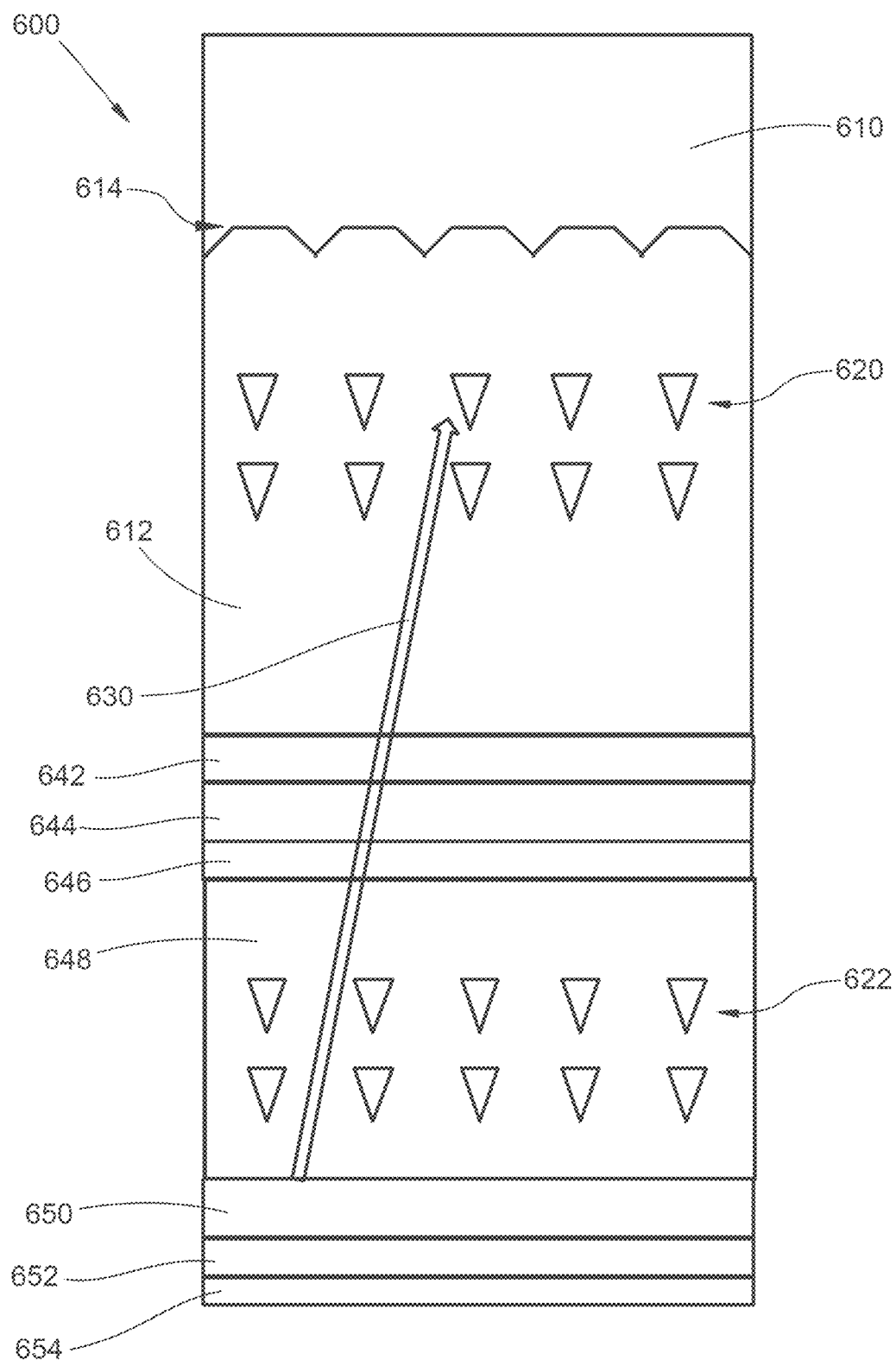
FIG. 6 illustrates an LED structure with multiple active layers and multiple layers of epi with dielectric nanoantennas embedded.

FIG. 6 illustrates an LED structure 600 with multiple active layers and multiple layers of epi embedded dielectric nanoantenna. Epi embedded dielectric nanoantenna 620 and 622 can reduce reabsorption of light and redirect oblique incident light to improve overall light coupling efficiency. A substrate 610 has an epitaxial layer 612 grown on an interface 614. In the illustrated embodiment, substrate 610 and interface 614 can be a patterned sapphire substrate. During growth of the epitaxial layer 112, dielectric nanoantenna 120 can be grown. Additional layers including a first active region 642, epi layer 644, tunnel junction layer 646, epi layer 648, a second active region 650, epi layer 652, and contact 654 (optionally a mirror) can also be grown or deposited.

In effect, stacked arrays of dielectric nanoantennas 620 and 622 placed on either side of stacked LED active regions (enabled by tunnel junctions) will guide internal radiation patterns for optimal extraction. This would help to steer the light (e.g. light 630) within the die for improved first pass extraction as well as reducing the probability of light emitted from first active region 642 from being absorbed by second active region 650.

Figure 7:
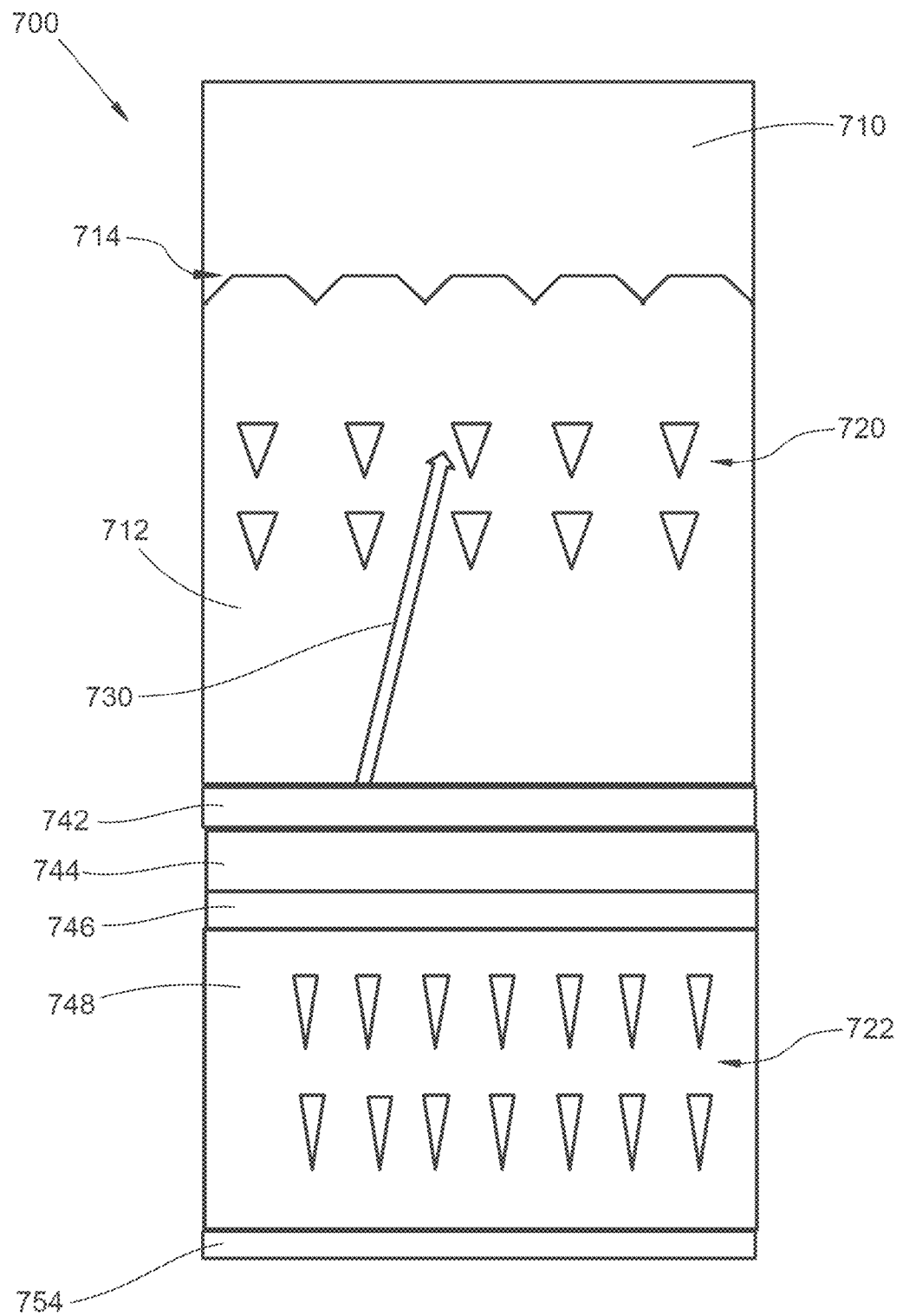
FIG. 7 illustrates multiple layers of epi with dielectric nanoantennas having different periodic spacing embedded.

FIG. 7 illustrates multiple layers of epi embedded dielectric nanoantenna having different periodic spacing. They could also be placed between a single active region and positive contact (enabled by tunnel junction) as in FIG. 6. Epi embedded dielectric nanoantenna 720 and 722 with optional different respective dielectric nanoantenna size, height, periodic spacing, or materials can reduce reabsorption of light and redirect oblique incident light to improve overall light coupling efficiency. A substrate 710 has an epitaxial layer 712 grown on an interface 714. In the illustrated embodiment, substrate 710 and interface 714 can be a patterned sapphire substrate. During growth of the epitaxial layer 712, dielectric nanoantenna 720 can be grown. Additional layers including a first active region 742, epi layer 744, tunnel junction layer 746, epi layer 748 with embedded dielectric nanoantenna 722 to steer light 730 and contact 754 can also be grown or deposited. As in earlier discussed alternatives, dielectric nanoantenna arrays can reduce the amount of light that interacts with the positive contact layer and helps steer internal radiation patterns for optimized first pass extraction.

Typically, the described LED structures will be used in conjunction with additional LED packaging, power and control circuitry, and optics. For example, LED packages can contain phosphor material bound together with silicone or phosphor material formed into a ceramic. In some embodiments, silicone bound phosphor material can form sidewalls that can be coated with metals, light reflective materials, or mirrors (e.g. a distributed Bragg reflector—"DBR mirror").

Phosphors can include one or more wavelength converting materials able to create white light or monochromatic light of other colors. All or only a portion of the light emitted by the LED may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. Phosphors bound together with silicone can be molded, dispensed, screen printed, sprayed, or laminated.

In one embodiment, light reflection material used in LED packaging can be a metallized layer. In other embodiments, a dielectric mirror or DBR can be used. In some embodiments, light reflection material can include a thin layer of a binder such as silicone and light reflective particles. Light reflective material can also include organic, inorganic, or organic/inorganic binder and filler material. For example, organic/inorganic binder and filler can be, for example, silicone with embedded reflective titanium oxide ($TiO_2$), $SiO_2$, or other reflective/scattering particles. Inorganic binders can include sol-gel (e.g., a sol-gel of TEOS or MTMS) or liquid glass (e.g., sodium silicate or potassium silicate), also known as water glass. In some embodiments, binders can include fillers that adjust physical properties. Fillers can include inorganic nanoparticles, silica, glass particles or fibers, or other materials able to improve optical or thermal performance. The light reflective material can be applied to the sidewalls by various processes, including evaporative deposition (for metals) atomic layer deposition (for DBR mirrors), or molding, dispensing, screen printing, spray, or lamination (for reflective particles in a binder).

In still other embodiments primary or secondary optics can be attached or positioned near the phosphors in LED package. Optics can include concave or convex lenses, lenslet arrays, graded index lens, reflectors, scattering elements, beam homogenizers, diffusers, or other light focusing or blurring optics. Protective layers, transparent layers, thermal layers, or other packaging structures can be used as needed for specific applications.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An LED structure, comprising
   a substrate with a first patterned surface;
   a first epi layer of GaN grown on the first patterned surface of the substrate and comprising a second patterned surface forming an interface with the first patterned surface of the substrate, the interface arranged to increase outcoupling of light travelling through the epi layer into the substrate;
   an active region in direct contact with the first epi layer;
   a first plurality of dielectric nanoantennas arranged to form more than one plane, the first plurality of dielectric nanoantennas positioned within the first epi layer between the active region and substrate and spaced apart from the interface, each of the first plurality of dielectric nanoantennas having a blunt end facing the interface and comprising a core material and a shell material, a narrower end opposite the blunt end facing away from the interface with a narrower diameter than the blunt end and comprising of the shell material, and at least one side surface connecting the blunt end and the narrower end and consisting of the shell material, each of the blunt end, the narrower end, and the at least one side surface being in direct contact with the first epi layer, the first plurality of dielectric nanoantennas arranged to allow transmission of light travelling through the epi layer into the substrate;
   a contact layer on an opposite side of the first epi layer from the substrate;
   a tunnel junction layer adjacent to the active region;
   a second epi layer positioned on an opposite side of the active region from the first epi layer to be between the active region and the contact layer; and
   a second plurality of dielectric nanoantennas arranged within the second epi layer to form more than one plane, each of the second plurality of dielectric nanoantennas having a blunt end facing the interface and a narrower end opposite the blunt end facing away from the interface with a narrower diameter than the blunt end.

2. The structure of claim 1, wherein each of the first and second plurality of dielectric nanoantennas has a height less than 1000 nm and a base diameter less than 2000 nm.

3. The structure of claim 1, wherein the dielectric nanoantennas are arranged to reflect more light via the blunt end than the narrower end.

4. The structure of claim 1, wherein at least some of the first plurality of dielectric nanoantennas define a periodic pattern in a plane having a periodic spacing different from that of the second plurality of dielectric nanoantennas.

5. The structure of claim 1, further comprising a second active region between the second epi layer and the contact layer.

6. The structure of claim 1, wherein the contact layer is mirrored.

7. The structure of claim 1, wherein the first plurality of dielectric nanoantennas collimates at least some of the light travelling through the epi layer into the substrate.

8. The structure of claim 1, wherein the first plurality of dielectric nanoantennas are arranged to allow at least a 10% different in transmission of light travelling through the epi layer into the substrate compared to light travelling into the epi layer from the substrate back through the epi layer, for at least some angles of incidence.

9. The structure of claim 1, wherein the contact layer is non-mirrored.

10. The structure of claim 1, wherein each of the more than one plane of the first nanoantennas has a same periodic spacing as the more than one plane of the second nanoantennas.

11. The structure of claim 1, wherein each of the more than one plane of the first nanoantennas has a different periodic spacing as the more than one plane of the second nanoantennas.

12. The structure of claim 1, wherein each of the more than one plane of the first nanoantennas has a different periodic spacing as the more than one plane of the second nanoantennas.

13. The structure of claim 1, wherein each of the first nanoantennas has a different height than each of the second nanoantennas.

14. The structure of claim 1, wherein each of the first nanoantennas has a different width than each of the second nanoantennas.

15. The structure of claim 1, wherein each of the first nanoantennas has a different material than each of the second nanoantennas.

16. The structure of claim 1, wherein the second epi layer is in direct contact with the contact layer.

17. The structure of claim 1, wherein the second epi layer is not in direct contact with the contact layer.

18. The structure of claim 1, wherein the substrate is sapphire.

19. The structure of claim 1, wherein the blunt end of each of the first dielectric nanoantennas is a flat circular base.

20. The structure of claim 1, wherein the first dielectric nanoantennas are conical in shape.

* * * * *